United States Patent
Youssef et al.

(10) Patent No.: US 9,350,310 B2
(45) Date of Patent: May 24, 2016

(54) RECEIVER FRONT END FOR CARRIER AGGREGATION

(71) Applicant: QUALCOMM Incorporated, San Diego, CA (US)

(72) Inventors: Ahmed A Youssef, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 303 days.

(21) Appl. No.: 13/901,924

(22) Filed: May 24, 2013

(65) Prior Publication Data

US 2014/0348274 A1    Nov. 27, 2014

(51) Int. Cl.
| | |
|---|---|
| H04B 1/16 | (2006.01) |
| H03G 3/20 | (2006.01) |
| H03F 1/22 | (2006.01) |
| H03F 3/193 | (2006.01) |
| H03F 3/68 | (2006.01) |
| H04B 1/18 | (2006.01) |
| H03G 1/00 | (2006.01) |

(52) U.S. Cl.
CPC ............. *H03G 3/20* (2013.01); *H03F 1/223* (2013.01); *H03F 3/193* (2013.01); *H03F 3/68* (2013.01); *H03G 1/0023* (2013.01); *H04B 1/18* (2013.01); *H03F 2200/492* (2013.01)

(58) Field of Classification Search
None
See application file for complete search history.

(56) References Cited

U.S. PATENT DOCUMENTS

| | | | |
|---|---|---|---|
| 9,154,087 B2 | 10/2015 | Jin et al. | |
| 2004/0066236 A1 | 4/2004 | Fujimoto et al. | |
| 2008/0074228 A1* | 3/2008 | Erickson et al. | 336/200 |
| 2009/0174481 A1 | 7/2009 | Chang | |
| 2009/0258624 A1 | 10/2009 | Gudem et al. | |
| 2011/0018635 A1* | 1/2011 | Tasic et al. | 330/277 |

(Continued)

FOREIGN PATENT DOCUMENTS

| | | |
|---|---|---|
| EP | 2555430 A1 | 2/2013 |
| GB | 2490976 A | 11/2012 |

OTHER PUBLICATIONS

International Search Report and Written Opinion—PCT/US2014/038871—ISA/EPO—Oct. 2, 2014.

*Primary Examiner* — Lana N Le
(74) *Attorney, Agent, or Firm* — Smith Risley Tempel Blaha LLC (57) ABSTRACT

Techniques for providing a receiver front end supporting carrier aggregation with gain alignment and improved matching across modes. In an aspect, auxiliary circuitry is configurable to selectively enable or disable mutual coupling between a source degeneration inductor of an LNA input transistor and an auxiliary inductor. A negative turns ratio coupling is provided between the inductors, such that the effective inductance of the source degeneration inductor is lowered when mutually coupled to the auxiliary inductor. In a non-carrier aggregation (non-CA) mode, the auxiliary inductor is disabled, while in a carrier aggregation (CA) mode, the auxiliary inductor is enabled. In this manner, using a single transistor, gain alignment across non-CA and CA modes is achieved. Furthermore, matching is preserved across non-CA and CA modes using a single external matching component.

15 Claims, 7 Drawing Sheets

(56) References Cited

U.S. PATENT DOCUMENTS

| | | | |
|---|---|---|---|
| 2011/0068871 A1* | 3/2011 | Fujimoto | 330/277 |
| 2011/0133838 A1* | 6/2011 | Paul et al. | 330/259 |
| 2012/0056680 A1* | 3/2012 | Kim et al. | 330/307 |
| 2012/0327825 A1 | 12/2012 | Gudem et al. | |
| 2013/0043946 A1 | 2/2013 | Hadjichristos et al. | |
| 2013/0059583 A1 | 3/2013 | Van Phan et al. | |
| 2014/0113578 A1* | 4/2014 | Xu | H03F 1/223 455/232.1 |
| 2014/0227988 A1* | 8/2014 | Sato et al. | 455/127.3 |

* cited by examiner

RECEIVER FRONT END FOR CARRIER AGGREGATION

BACKGROUND

1. Field

The disclosure relates to communications circuitry, and in particular, to a receiver front end supporting carrier aggregation.

2. Background

Receiver (RX) carrier aggregation is a feature supported in modern wireless devices wherein signals on multiple carriers are simultaneously processed by a receiver. For example, a low-noise amplifier (LNA) of a receiver may simultaneously amplify a first signal corresponding to a first carrier and a second signal corresponding to a second carrier, and supply the amplified first and second signals to first and second loads, respectively, for further processing.

A receiver supporting carrier aggregation (CA) is typically also required to support non-carrier aggregation (non-CA) operation for backwards compatibility. In such cases, the performance of the LNA should be maintained across both the CA and non-CA modes. For example, it would be desirable to design the LNA such that the gain provided to the received signal is not significantly affected by whether the receiver is operating in CA mode or non-CA mode, a feature also denoted herein as "gain alignment" across modes. Gain alignment helps the receiver meet sensitivity requirements for both modes, and also simplifies the baseband settings and modem programming requirements. It would further be desirable to maintain the input matching properties of the LNA across CA and non-CA modes for optimum performance.

Certain prior art receivers implement CA mode by providing separate input transistors, e.g., by providing a separate cascode amplifier for each carrier signal. A drawback of this approach is that more than one external matching component may be required to maintain matching across modes. For example, according to this approach, an L-C (inductor-capacitor) match or L-L (inductor-inductor) match may be needed to preserve the matching across non-CA and CA modes. Other prior art implementations provide a single input transistor having a drain coupled to multiple cascode transistors (e.g., one cascode transistor for each carrier). A drawback of such an approach is that the quality of the matching will generally degrade in CA mode versus non-CA mode, due to the different levels of current required for the modes. Furthermore, more power may be needed in CA mode to maintain gain alignment.

Accordingly, it would be desirable to provide a receiver front end that efficiently maintains gain alignment across both CA and non-CA modes while minimizing the number of required external matching elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
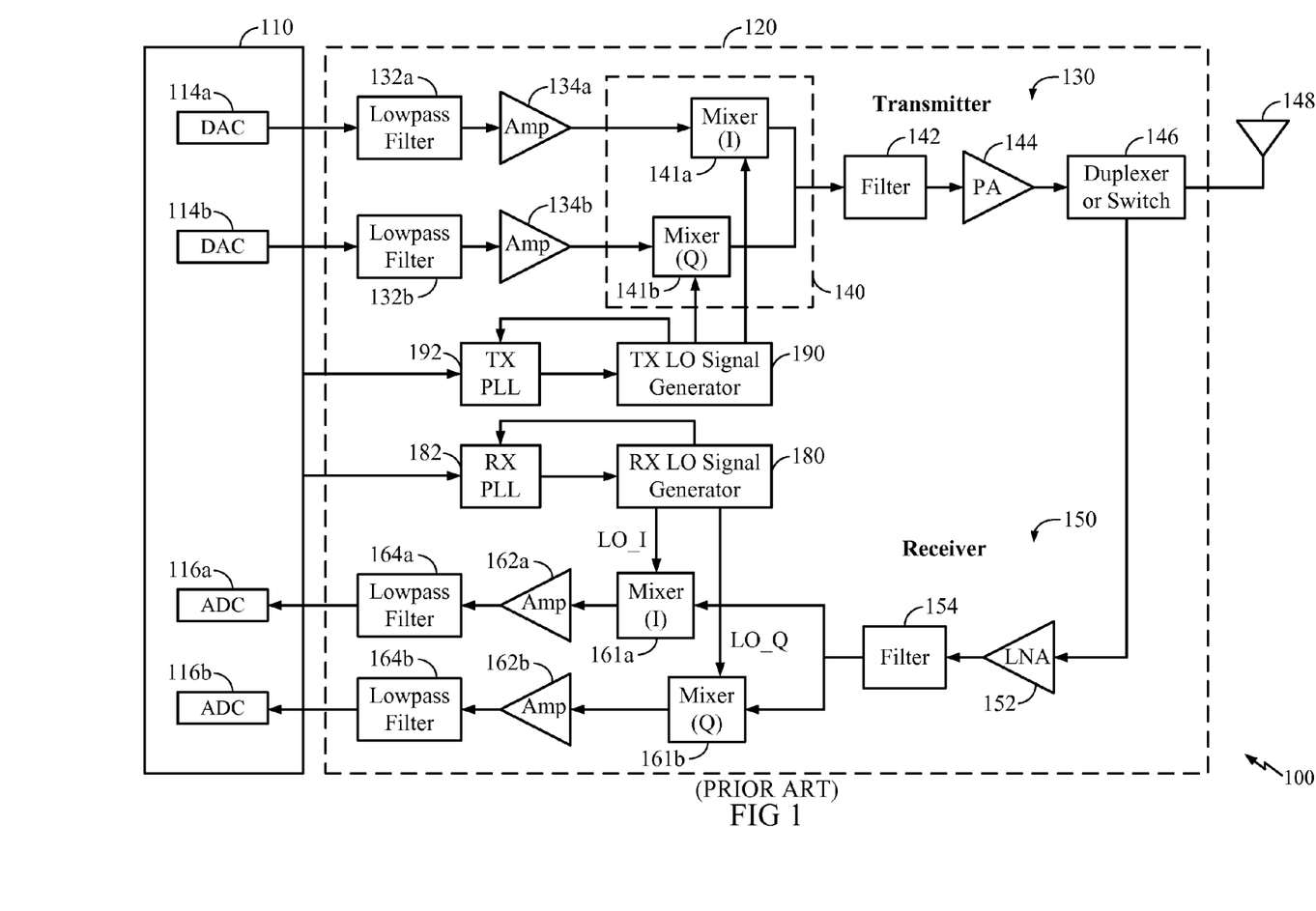
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114*a* and 114*b* for converting digital signals generated by the data processor 110 into the I and Q analog output signals, e.g., I and Q output currents, for further processing.

Within transmitter 130, lowpass filters 132*a* and 132*b* filter the I and Q analog output signals, respectively, to remove undesired images caused by the prior digital-to-analog conversion. Amplifiers (Amp) 134*a* and 134*b* amplify the signals from lowpass filters 132*a* and 132*b*, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161*a* and 161*b* mix the output of filter 154 with I and Q receive (RX) LO signals (i.e., LO_I and LO_Q) from an RX LO signal generator 180 to generate I and Q baseband signals. The I and Q baseband signals are amplified by amplifiers 162*a* and 162*b* and further filtered by lowpass filters 164*a* and 164*b* to obtain I and Q analog input signals, which are provided to data processor 110. In the exemplary embodiment shown, the data processor 110 includes analog-to-digital-converters (ADC's) 116*a* and 116*b* for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

In certain implementations (not shown in FIG. 1), a balun may be provided between the output of the LNA 152 and the mixers 161*a*, 161*b* of the receiver 150. The balun may convert a single-ended signal to a differential signal, and may include, e.g., a transformer that mutually couples a signal from a primary winding to a secondary winding. Furthermore, in certain alternative implementations not shown, a plurality of LNA's 152 may be provided, wherein each LNA is optimized to process an input RF signal in a particular frequency band.

In certain state-of-the-art receivers, a mode of operation known as carrier aggregation (CA) may be supported. When carrier aggregation mode is enabled, a single LNA 152 may simultaneously process two (or more) carriers lying in the same band, e.g., by generating two output signals from one input voltage, each output signal corresponding to a separate carrier. In such receivers, carrier aggregation may typically also be selectively disabled, such that (in the non-CA mode) the LNA 152 may also process only one carrier.

Figure 2:
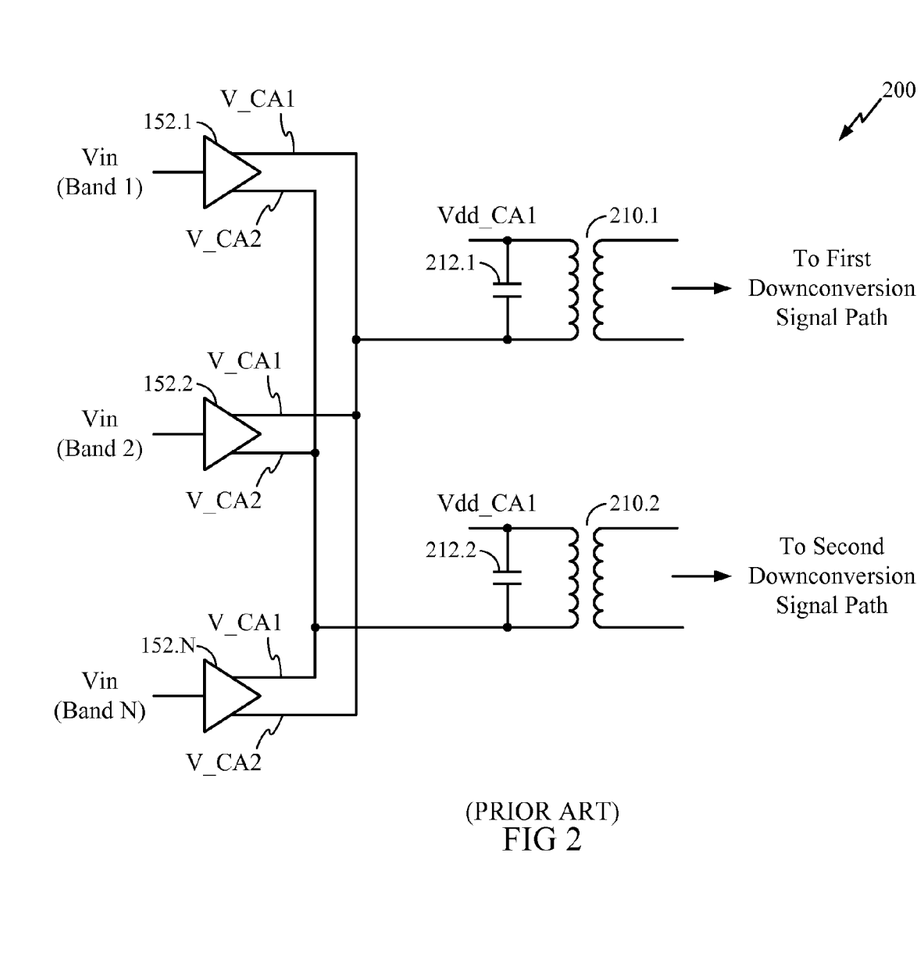
FIG. 2 illustrates a prior art implementation of a receiver front end supporting carrier aggregation.

FIG. 2 illustrates a prior art implementation of a receiver front end 200 supporting carrier aggregation. In FIG. 2, a plurality of LNA's 152.1 through 152.N is provided, wherein N is an integer corresponding the total number of LNA's. It will be appreciated that the plurality of LNA's 152.1 through 152.N may be provided, e.g., in lieu of the single LNA 152 shown in the receiver 150 of FIG. 1, in those cases wherein the receiver 150 is capable of supporting carrier aggregation over multiple bands. The integration of the receiver front end 200 with the rest of the receiver 150 of FIG. 1 will be clear to one of ordinary skill in the art in light of the present disclosure.

As shown in FIG. 2, the input to each LNA may be a common RF input voltage Vin, and each LNA may be designed and optimized to process a particular frequency band for Vin, e.g., Band 1, Band 2, etc. It will be appreciated that the denotation of a "Band" in FIG. 2 and generally in this specification need not correspond to any frequency band specifically defined in any communications standard, and may instead generically denote a continuous allocation of frequency across any frequency range that is capable of being processed by an LNA. In an implementation (not explicitly shown), each of the LNA's 152.1 through 152.N may be provided with an enable/disable signal, such that the LNA most suitable for processing the received RF input voltage Vin may be selectively enabled at any time.

In FIG. 2, each of the LNA's 152.1 through 152.N is further configured for carrier aggregation. In the particular implementation shown in FIG. 2, each LNA supports dual carrier aggregation and includes two output terminals, respectively coupled to a first (single-ended) voltage V_CA1 corresponding to the first carrier, and a second (single-ended) voltage V_CA2 corresponding to the second carrier. V_CA1 is further coupled to a first transformer 210.1, which transforms the single-ended voltage V_CA1 into a differential voltage for further processing by a filter and/or mixer of a first downconversion signal path. Similarly, V_CA2 is coupled to a second transformer 210.2, which transforms V_CA2 into a differential voltage for further processing by a filter and/or mixer of a second downconversion signal path. In the implementation shown, a capacitor 212.1 or 212.2 is further provided for each transformer.

It will be appreciated that while certain aspects of the present disclosure are described with reference to dual carrier aggregation, i.e., carrier aggregation accommodating two simultaneous carriers, the techniques described herein may readily be applied to carrier aggregation accommodating more than two simultaneous carriers. Such alternative exemplary embodiments are contemplated to be within the scope of the present disclosure.

Per the receiver front end 200, when carrier aggregation mode is enabled, both V_CA1 and V_CA2 correspond to signals actively being received by an LNA, e.g., RF input signals corresponding to each carrier of a dual carrier aggregation scheme. In the carrier aggregation mode, each LNA generates two output voltages, and each output voltage is separately processed by either the first down-conversion signal path or the second down-conversion signal path. In contrast, when carrier aggregation mode is disabled (i.e., during non-CA mode), only one of the voltages V_CA1 and V_CA2 corresponds to a signal actively being received by the LNA. In this case, only one of the transformers 210.1 and 210.2 will be coupled to the active RF receive signal, which may be either V_CA1 or V_CA2, and only one of the first and second down-conversion signal paths will be operational to down-convert the received single carrier signal.

Figure 3:
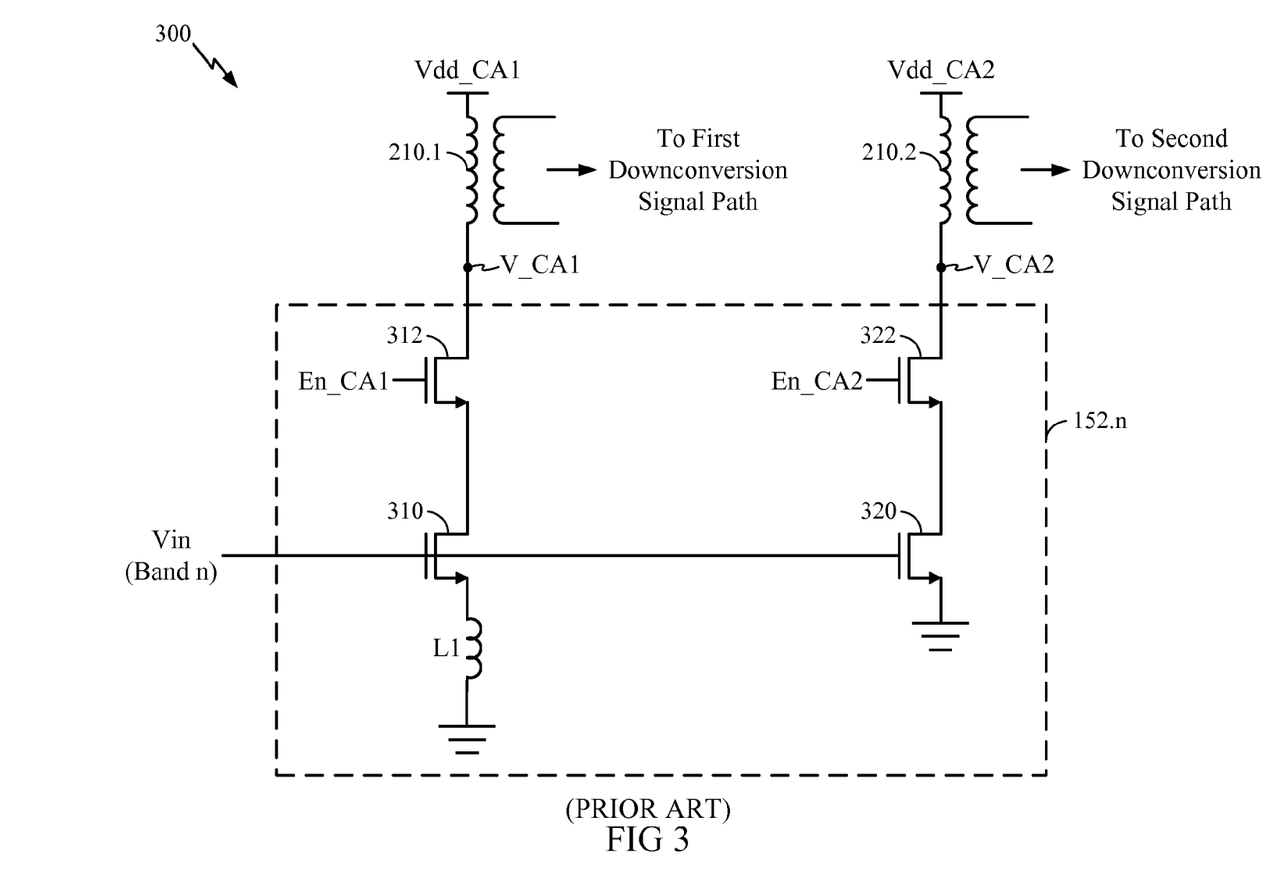
FIG. 3 shows an illustrative prior art implementation of an LNA and transformer network for supporting carrier aggregation.

FIG. 3 shows an illustrative prior art implementation 300 of an LNA and transformer network for supporting carrier aggregation. Note while the implementation of an arbitrary one 152.$n$ of the LNA's 152.1 through 152.N is shown in FIG. 3, it will be appreciated that the other LNA's in FIG. 2 (not shown in FIG. 3) may adopt similar architectures. Note in this case, n is an integer index from 1 to N.

In FIG. 3, the LNA 152.$n$ includes a first input transistor 310 and a second input transistor 320. The RF input voltage Vin (containing a Band n signal) is coupled to the gates of both the first and second input transistors 310, 320 in common-source amplifier configurations. The LNA 152.$n$ further includes a first cascode transistor 312 and a second cascode transistor 322 coupled to input transistors 310 and 320, respectively. The gates of transistors 312 and 322 are coupled to control bias voltages En_CA1 and En_CA2, respectively. Collectively, transistors 310 and 312 form a first cascode amplifier with output coupled to V_CA1, and transistors 320 and 322 form a second cascode amplifier with output coupled to V_CA2. By setting the levels of control bias voltage En_CA1 and/or En_CA2, the first and second cascode amplifiers may be selectively turned on or off depending on the mode of operation.

In particular, during a carrier aggregation mode, En_CA1 and En_CA2 may both be set high, such that both first and second cascode amplifiers are operational to couple the amplified voltages V_CA1 and V_CA2 to the first transformer 210.1 and the second transformer 210.2, respectively. During a non-carrier aggregation mode, En_CA1 may be set high while En_CA2 may be set low (or vice versa), such that only the first cascode amplifier is operational to amplify the input voltage Vin for coupling V_CA1 to the first transformer 210.1, while the second cascode amplifier is turned off.

Note there are certain disadvantages associated with the circuitry 152.$n$ for implementing carrier aggregation shown in FIG. 3. For example, the multiple input transistors 310, 320 generally require multiple elements (not shown) for matching, e.g., an L-L-C match including a series inductor (Lseries), shunt inductor (Lshunt), and series capacitor (Cseries) to ensure good matching in both non-CA and CA modes, not shown in FIG. 2.

Figure 4:
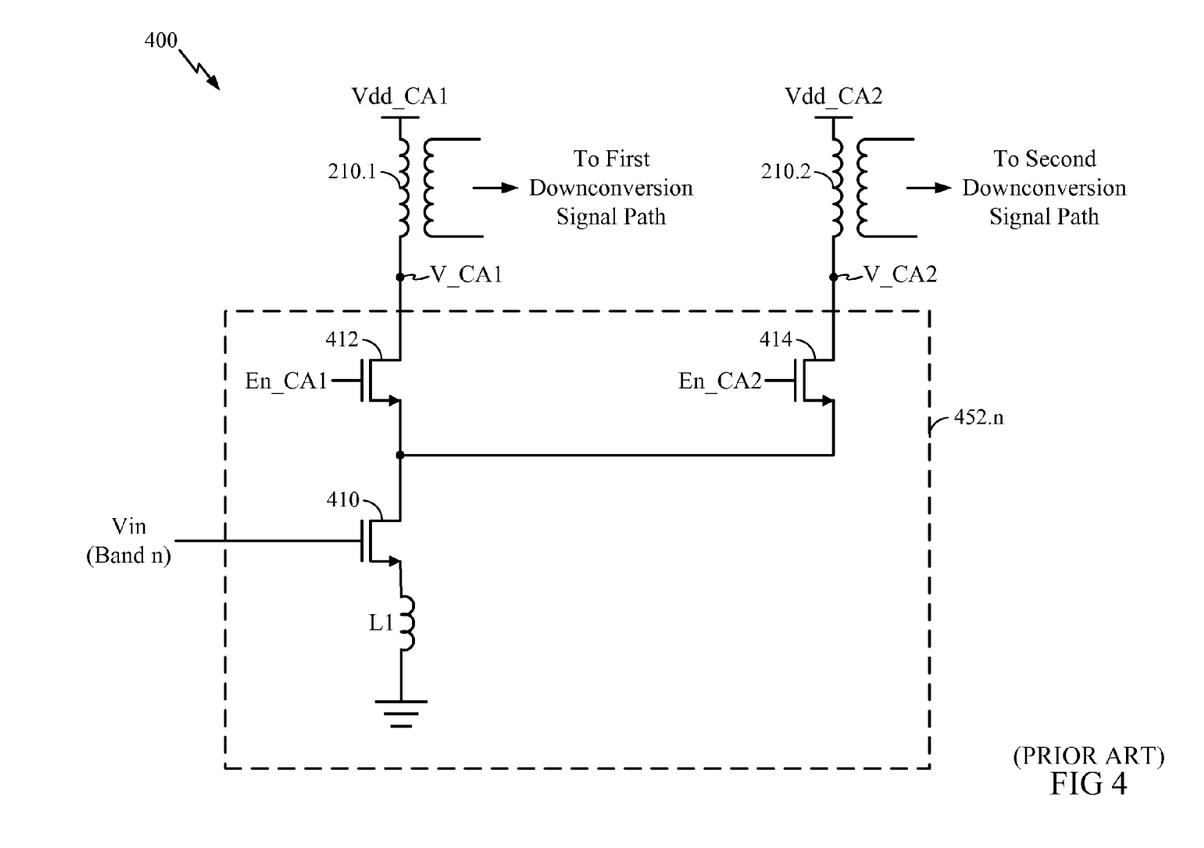
FIG. 4 illustrates an alternative prior art implementation of an LNA and transformer network supporting carrier aggregation.

FIG. 4 illustrates an alternative prior art implementation 400 of an LNA and transformer network supporting carrier aggregation. In FIG. 4, LNA 452.$n$ includes a single input transistor 410 (also denoted herein as a "first transistor") coupled to the RF input voltage Vin. The drain of the single input transistor 410 is coupled to both a first cascode transistor 412 and a second cascode transistor 414. The drain of the first cascode transistor 412 is coupled to V_CA1 and the first transformer 210.1, while the drain of the second cascode transistor 414 is coupled to V_CA2 and the second transformer 210.2. Similarly to the implementation 300 shown in FIG. 3, the gates of the cascode transistors 412 and 414 are coupled to control bias voltages En_CA1 and En_CA2, respectively, which are configured to select between carrier aggregation and non-carrier aggregation modes for the LNA 452.$n$ by turning on or off the first and second cascode transistors 412, 414, respectively.

It will be appreciated that the implementation 400 advantageously adopts a single input transistor 410, as opposed to the two input transistors 310, 320 used in the implementation 300. This simplifies the design of the amplifier, as well as the input matching network for the LNA. However, it will also be noted that, since the loading of the input transistor 410 will be different depending on whether one or two of the cascode transistors 412, 414 are enabled, the gain of the LNA 452.$n$ (e.g., the gain provided from the input voltage Vin to V_CA1 or V_CA2) may vary significantly depending on whether carrier aggregation mode or non-carrier aggregation mode is selected.

In particular, to ensure gain alignment across CA and non-CA modes, the bias currents for the cascode amplifiers would have to be increased by up to four times, since doubling bias current generally increases transistor transconductance gm by only a factor of square root of 2. Furthermore, in general, multiple matching components may be required to ensure adequate matching across both the CA and non-CA modes, as the matching may be unacceptably degraded across modes if only a single external matching component is used. Accordingly, it would be desirable to provide techniques for designing an LNA supporting carrier aggregation mode that do not suffer from the drawbacks of the prior art.

Figure 5:
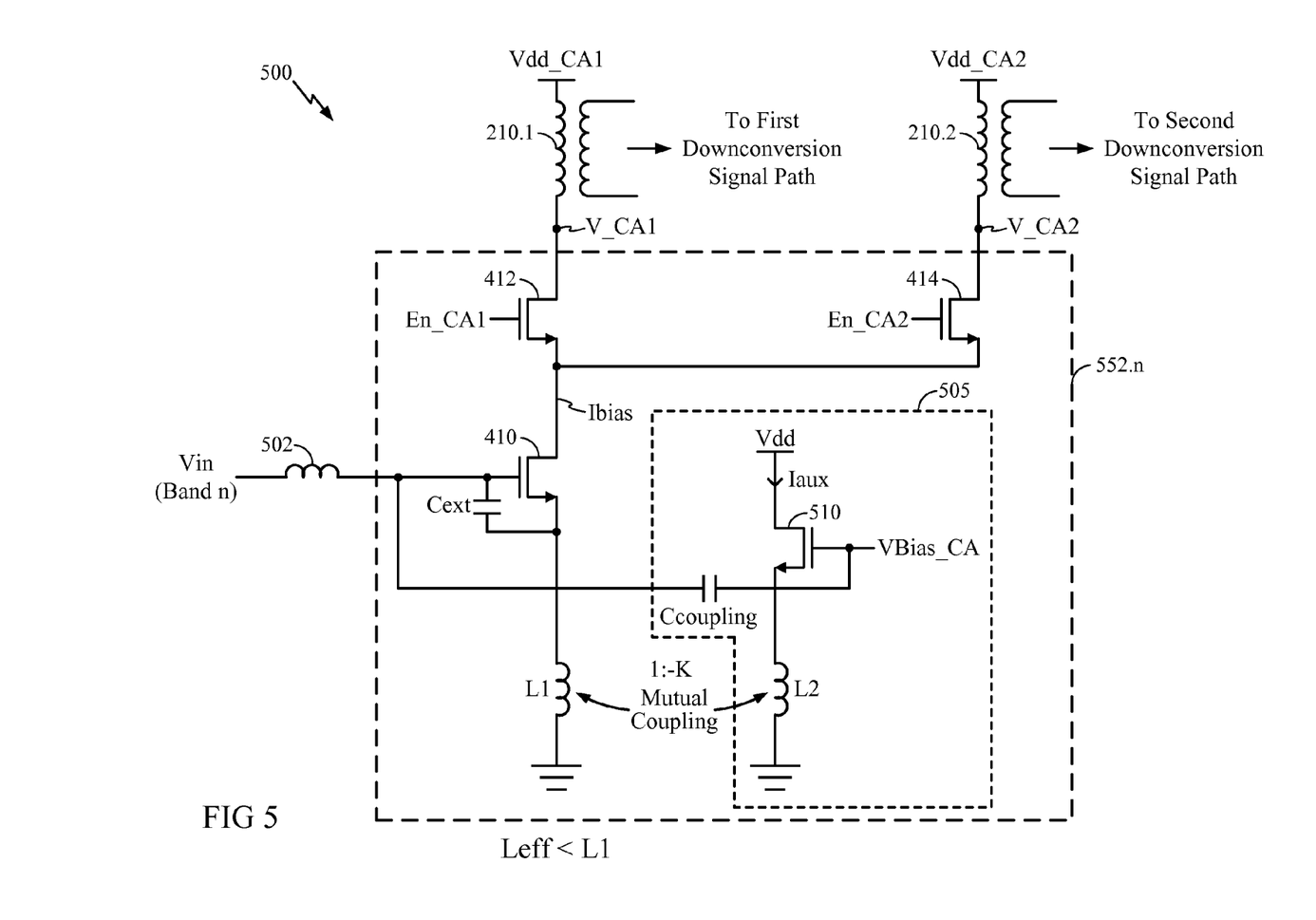
FIG. 5 illustrates an exemplary embodiment of an LNA according to the present disclosure.

FIG. 5 illustrates an exemplary embodiment 500 of an LNA according to the present disclosure. Note FIG. 5 is shown for illustrative purposes only, and is not meant to limit the scope of the present disclosure.

In FIG. 5, auxiliary circuitry 505 is provided and coupled to elements of the LNA 552.$n$ in the manner described hereinbelow. In particular, the auxiliary circuitry 505 includes an auxiliary transistor 510 (also denoted herein as a "second transistor") having a gate DC-coupled to a configurable bias voltage VBias_CA. The gate of auxiliary transistor 510 is further AC-coupled via coupling capacitor Ccoupling to the RF input voltage Vin. The source of auxiliary transistor 510 is coupled to an auxiliary inductor L2 (also denoted herein as a "second inductance") mutually (magnetically) coupled to an inductor L1 (also denoted herein as a "first inductance") present at the source of the input transistor 410. It will be appreciated that the inductor L1 provides RF source degeneration for the input transistor 410, and may be present in typical cascode amplifier implementations of an LNA, e.g., as shown in the implementations of FIGS. 3 and 4. A series gate inductance 502 is further shown coupling the gate of input transistor 410 to the input voltage Vin.

In an exemplary embodiment, inductors L1 and L2, which may be considered as forming a primary and secondary winding, respectively, of a transformer, are mutually coupled such that their coupling ratio is 1:−K, wherein −K is a negative number. It will be appreciated that a negative mutual coupling ratio may be achieved by appropriately setting the polarities of the primary versus the secondary windings. The operation of the LNA 552.n may be described as follows.

In a non-carrier aggregation (non-CA) mode, only one of En_CA1 and En_CA2 is set high. For example, En_CA1 may be high while En_CA2 is low, or alternatively, En_CA2 may be high while En_C1 is low. Furthermore, the bias voltage VBias_CA is low (e.g., set to a ground voltage 0V) to turn off the auxiliary transistor 510. Accordingly, transistor 510 supports no bias current (i.e., Iaux is zero). As there is no current flow through auxiliary inductor L2, L2 will not affect the inductance of inductor L1 (e.g., through mutual magnetic coupling or any other mechanism). Accordingly, the full inductance value of L1 will be present at the source of input transistor 410. Note in non-CA mode, the bias current Ibias of transistor 410 may correspond to a first value, e.g., Ibias1, as set by a gate bias voltage of transistor 410.

During CA mode, En_CA1 and En_CA2 are both set high. Furthermore, the bias voltage VBias_CA is set high (e.g., to 700 mV) to turn on the auxiliary transistor 510. Accordingly, transistor 510 supports a non-zero bias current Iaux, and inductors L1 and L2 are mutually magnetically coupled with a coupling ratio 1:−K. Note as the L1:L2 coupling ratio is negative, the mutual coupling will act to reduce the inductance of L1 when the auxiliary transistor 510 is turned on. For example, the effective inductance of L1 in carrier aggregation mode may correspond to an inductance Leff<L1. Note the input voltage Vin will also be coupled via coupling capacitor Ccoupling to the gate of the active auxiliary transistor 510 to modulate the current Iaux through transistor 510 in CA mode.

In CA mode, the bias current Ibias of transistor 410 may correspond to a second value, e.g., Ibias2, as set by the gate bias voltage of transistor 410. In certain exemplary embodiments, Ibias2 may be approximately double Ibias1 to achieve acceptable noise performance in both CA and non-CA modes. In an exemplary embodiment, due to Ibias2 being greater than Ibias1, the input matching in CA mode may be degraded as compared to non-CA mode. Accordingly, Leff, or the degeneration inductance, may be reduced in CA mode to maintain optimal input matching properties. Note while Ibias2 is described hereinabove as being approximately double Ibias1 for certain exemplary embodiments, note in alternative exemplary embodiments, Ibias2 need not be double Ibias1. For example, Ibias2 may be equal to Ibias1, or may take on another value relative to Ibias1, in alternative exemplary embodiments. Such alternative exemplary embodiments are contemplated to be within the scope of the present disclosure.

It will be appreciated that, by reducing the effective inductance of L1 during CA mode as compared to non-CA mode, the gain of the LNA 552.n (e.g., the gain provided from the input voltage Vin to V_CA1 or V_CA2) will be aligned across CA and non-CA modes. Accordingly, the LNA 552.n advantageously simplifies the design of baseband circuitry, e.g., digital circuitry and/or the design of a serial bus interface (SBI) for controlling the operation of the receiver front end across CA and non-CA modes. Furthermore, providing a single input transistor 410 capable of supporting both CA and non-CA modes simplifies trace routing on the receiver integrated circuit (IC), and helps ensure that the non-CA performance of the CA-capable LNA described herein approximates that of the conventional L-degenerated LNA (i.e., non-CA LNA). Providing the single input transistor 410 further simplifies electrostatic discharge (ESD) verification for the receiver.

In FIG. 5, an external capacitor Cext may be provided coupling the gate of the input transistor 410 to its source. In an exemplary embodiment, the capacitance of Cext may be made configurable to provide for optimum input matching of the LNA 552.n to the input voltage Vin. For example, Cext may be programmed to a first value in a first frequency band, and to a second value in a second frequency band.

It will further be appreciated that the input matching properties of the LNA 552.n will also depend on the effective inductance Leff of the degeneration inductance at the source of input transistor 410. In an exemplary embodiment, Leff during CA mode may be set to approximately half of L1 (i.e., the inductance of the source degeneration inductance of transistor 410 in the absence of the mutual coupling with L2).

Figure 6:
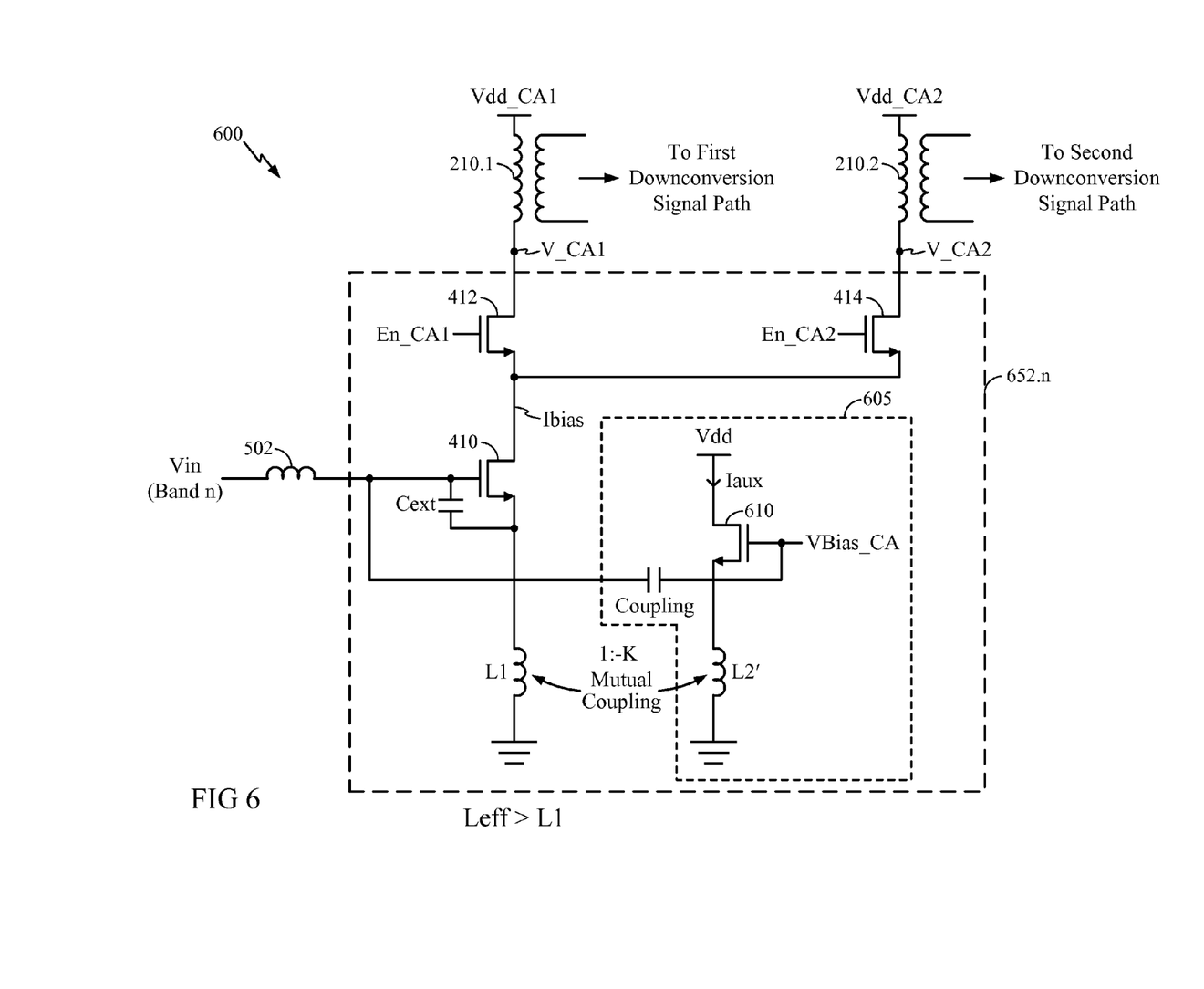
FIG. 6 illustrates an alternative exemplary embodiment of the present disclosure, where a positive coupling ratio between inductors L1 and L2 is used to implement the same techniques as described hereinabove with reference to FIG. 5.

FIG. 6 illustrates an alternative exemplary embodiment 600 of the present disclosure, where a positive coupling ratio between inductors L1 and L2 is alternatively used to implement the techniques described hereinabove with reference to FIG. 5. Note similarly labeled elements in FIGS. 5 and 6 may correspond to elements having similar functionality, unless otherwise noted. Further note certain details of operation of the circuitry 600 are omitted herein for ease of description, as such details will be apparent to one of ordinary skill in the art in view of the description of FIG. 5 given hereinabove.

In particular, in FIG. 6, auxiliary circuitry 605 includes an auxiliary transistor 610 and an auxiliary inductor L2' mutually coupled to inductor L1. Inductors L1 and L2' are coupled such that their mutual coupling ratio is 1:+K, wherein +K is a positive number. It will be appreciated that a positive mutual coupling ratio may be achieved by appropriately setting the polarities of the primary versus the secondary windings.

In an exemplary embodiment, the auxiliary circuitry 605 may be activated according to a reverse convention from that described for the auxiliary circuitry 505 shown in FIG. 5. In particular, in a non-CA mode, VBias_CA is high (e.g., set to 700 mV) to turn on the auxiliary transistor 610. In a CA mode, VBias_CA is low (e.g., set to ground voltage 0V) to turn off the auxiliary transistor 610. As the mutual coupling ratio is positive (+K) between L1 and L2' for the circuitry 600, the effective source degeneration inductance of transistor 410 will be lower in CA mode, and accordingly, gain alignment across modes will be maintained.

In certain cases, it will be appreciated that the topology in FIG. 5 may have better noise figure (NF) than that of the topology of FIG. 6, due to a reduction of Leff in non-CA mode due to the +K coupling ratio. In an alternative exemplary embodiment (not shown in FIG. 6), transistor 610 may be replaced by a PMOS switch, and VBias_CA may be accordingly altered to maintain the operation of the auxiliary circuitry as described hereinabove. Such alternative exemplary embodiments are contemplated to be within the scope of the present disclosure.

Figure 7:
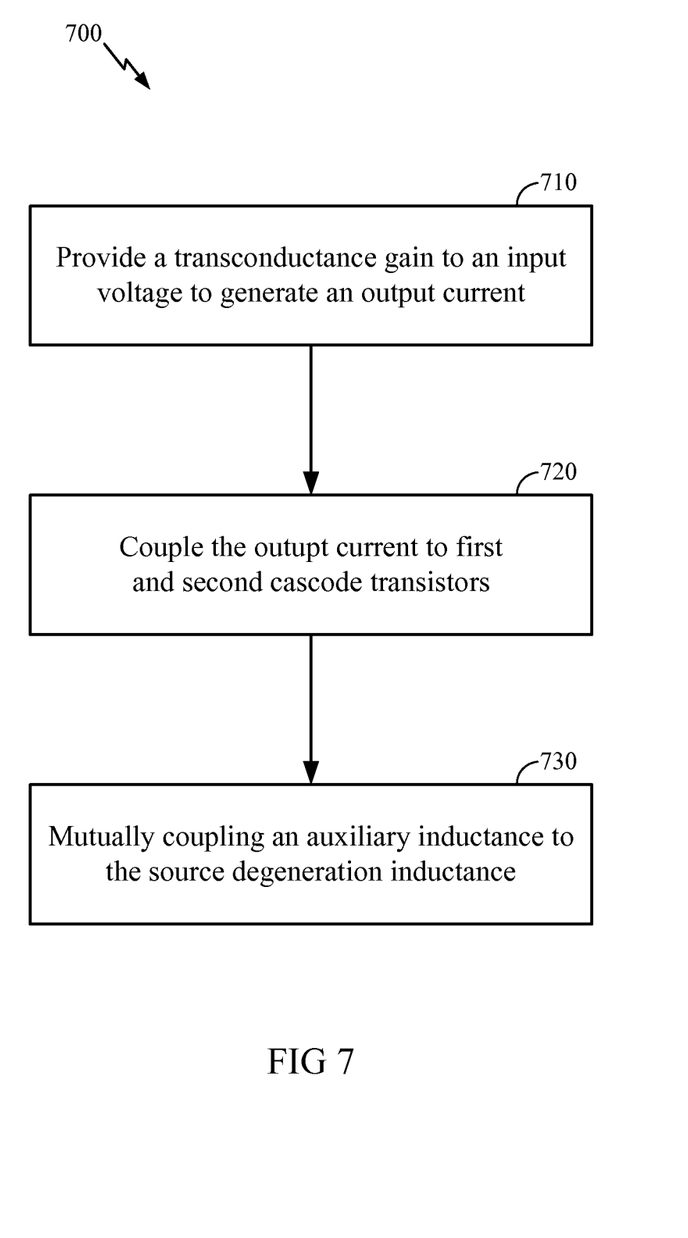
FIG. 7 illustrates an exemplary embodiment of a method according to the present disclosure.

FIG. 7 illustrates an exemplary embodiment of a method 700 according to the present disclosure. Note the method 700 is shown for illustrative purposes only, and is not meant to limit the scope of the present disclosure in any manner.

In FIG. 7, at block 710, a transconductance gain is provided to an input voltage to generate an output current. In an exemplary embodiment, a source degeneration inductance is coupled in series with the output current.

At block 720, the output current is coupled to first and second cascode transistors. In an exemplary embodiment, the drains of the first and second cascode transistors are coupled to first and second load circuits, respectively.

At block 730, an auxiliary inductance is mutually coupled to the source degeneration inductance. In an exemplary embodiment, the auxiliary inductance is coupled to the source of an auxiliary transistor comprising a gate coupled to the input voltage via a coupling capacitance.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
 a first transistor comprising a gate configured to receive an input signal and a source coupled to a first inductance;
 a second transistor comprising a gate configured to receive the input signal and a source coupled to a second inductance, wherein the first and second inductances are mutually coupled to each other; and
 first and second cascode transistors coupled to a drain of the first transistor, wherein during a non-carrier aggregation mode, one of the cascode transistors is disabled, and wherein during a carrier aggregation mode, the first and second cascode transistors are enabled,
 wherein during the non-carrier aggregation mode, the second transistor is disabled when the first and second inductances are coupled with a negative coupling factor and enabled when the first and second inductances are coupled with a positive coupling factor; and
 wherein during the carrier aggregation mode, the second transistor is enabled when the first and second inductances are coupled with a negative coupling factor and disabled when the first and second inductances are coupled with a positive coupling factor.

2. The apparatus of claim 1, wherein the first transistor is biased by a first DC voltage, the second transistor is biased by a second DC voltage, and the gate of the second transistor is configured to receive the input signal via a coupling capacitance.

3. The apparatus of claim 1, further comprising a matching capacitor (Cext) coupling the gate to the source of the first transistor.

4. The apparatus of claim 3, wherein the capacitance of the matching capacitor is programmable depending on the frequency band of operation.

5. The apparatus of claim 1, the first and second cascode transistors being coupled to first and second load circuits, respectively, wherein:
the first load circuit comprises a first winding of a first transformer, the first transformer further comprising a second winding mutually coupled to the first winding; and
the second load circuit comprises a first winding of a second transformer, the second transformer further comprising a second winding mutually coupled to the first winding of the second transformer.

6. The apparatus of claim 1, wherein the gate of the first transistor is further configured to receive the input signal via a series inductor.

7. The apparatus of claim 1, the gate of the first transistor further coupled to a bias voltage, wherein the bias voltage is greater during the carrier aggregation mode than during the non-carrier aggregation mode.

8. An apparatus comprising:
a first transistor comprising a gate configured to receive an input signal and a source coupled to a first inductance;
a second transistor comprising a gate configured to receive the input signal and a source coupled to a second inductance, wherein the first and second inductances are mutually coupled to each other;
a first load circuit comprising a first winding of a first transformer, the first transformer further comprising a second winding mutually coupled to the first winding;
a second load circuit comprising a first winding of a second transformer, the second transformer further comprising a second winding mutually coupled to the first winding of the second transformer;
a first cascode transistor coupled to a drain of the first transistor and the first load circuit; and
a second cascode transistor coupled to the drain of the first transistor and the second load circuit.

9. The apparatus of claim 8, wherein the first transistor is biased by a first DC voltage, the second transistor is biased by a second DC voltage, and the gate of the second transistor is configured to receive the input signal via a coupling capacitance.

10. The apparatus of claim 8, wherein:
the first and second inductances are mutually coupled with a negative coupling factor (−K);
during a non-carrier aggregation mode, one of the cascode transistors is disabled, and the second transistor is disabled; and
during a carrier aggregation mode, the first and second cascode transistors are enabled, and the second transistor is enabled.

11. The apparatus of claim 10, the gate of the first transistor further coupled to a bias voltage, wherein the bias voltage is greater during the carrier aggregation mode than during the non-carrier aggregation mode.

12. The apparatus of claim 8, wherein:
the first and second inductances are mutually coupled with a positive coupling factor (+K);
during a non-carrier aggregation mode, one of the cascode transistors is disabled, and the second transistor is enabled; and
during a carrier aggregation mode, the first and second cascode transistors are enabled, and the second transistor is disabled.

13. The apparatus of claim 8, further comprising a matching capacitor (Cext) coupling the gate to the source of the first transistor.

14. The apparatus of claim 13, wherein the capacitance of the matching capacitor is programmable depending on the frequency band of operation.

15. The apparatus of claim 8, wherein the gate of the first transistor is further configured to receive the input signal via a series inductor.

* * * * *